US006542366B2

(12) United States Patent
Davis et al.

(10) Patent No.: US 6,542,366 B2
(45) Date of Patent: Apr. 1, 2003

(54) CIRCUIT BOARD SUPPORT

(75) Inventors: David R. Davis, Jefferson, SD (US); Vernon Dory Erickson, Dakota Dunes, SD (US)

(73) Assignee: Gateway, Inc., Poway, CA (US)

( * ) Notice: Subject to any disclaimer, the term of this patent is extended or adjusted under 35 U.S.C. 154(b) by 15 days.

(21) Appl. No.: 09/750,725

(22) Filed: Dec. 28, 2000

(65) Prior Publication Data

US 2002/0105785 A1 Aug. 8, 2002

(51) Int. Cl.$^7$ ................................................ H05K 7/20
(52) U.S. Cl. ........................ 361/703; 361/704; 361/710; 361/719; 257/719; 165/80.3
(58) Field of Search ................................. 361/702–714, 361/717–719, 720–727, 740–742, 744, 752–754, 756, 759, 758, 760, 784, 799, 770, 787, 686–687; 174/138 E, 138 D, 138 G, 138 R, 156, 157, 252, 52.1, 15.1, 16.3; 257/706–727; 165/80.2, 80.3, 80.6, 185; 29/832, 834, 842

(56) References Cited

U.S. PATENT DOCUMENTS

| | | | | |
|---|---|---|---|---|
| 4,597,617 A | * | 7/1986 | Enochs | 339/17 F |
| 5,528,462 A | * | 6/1996 | Pendse | 361/767 |
| 5,557,503 A | * | 9/1996 | Isaacs et al. | 361/719 |
| 5,661,640 A | | 8/1997 | Mills et al. | 361/801 |
| 5,838,538 A | | 11/1998 | Yee | 361/683 |
| 5,909,865 A | | 6/1999 | Stahl | 248/346.03 |
| 5,930,115 A | * | 7/1999 | Tracy et al. | 361/704 |
| 5,966,289 A | * | 10/1999 | Hastings et al. | 361/704 |
| 6,056,601 A | | 5/2000 | Pollock et al. | 439/630 |
| 6,061,235 A | | 5/2000 | Cromwell et al. | 361/690 |
| 6,075,702 A | | 6/2000 | Gardner et al. | 361/704 |
| 6,078,498 A | | 6/2000 | Eckerd et al. | 361/685 |
| 6,082,695 A | | 7/2000 | Leong | 248/346.01 |
| 6,151,214 A | * | 11/2000 | Yeh | 361/695 |
| 6,223,815 B1 | * | 5/2001 | Shibasaki | 165/185 |
| 6,226,179 B1 | * | 5/2001 | Lee | 361/687 |
| 6,249,428 B1 | * | 6/2001 | Jeffries et al. | 361/684 |
| 6,359,783 B1 | * | 3/2002 | Noble | 361/704 |
| 6,384,331 B1 | * | 5/2002 | Ku | 174/52.1 |

* cited by examiner

Primary Examiner—Darren Schuberg
Assistant Examiner—Michael Datskovsky
(74) Attorney, Agent, or Firm—William J. Breen, III; Scott Charles Richardson; Suiter & Associates

(57) ABSTRACT

The present invention is directed to an improved circuit board support. The present invention provides for quick-assembly, limits circuit board flex, and supports a heat sink. In one aspect of the present invention, an apparatus suitable for supporting a circuit board, includes a support suitable for attachment to a chassis of an information handling system, wherein a heat sink may be attached through a printed circuit board to the support so as to enable the heat sink to be supported by the chassis.

19 Claims, 4 Drawing Sheets

CIRCUIT BOARD SUPPORT

FIELD OF THE INVENTION

The present invention generally relates to the field of mounting assemblies, and particularly to a quick-assembly circuit board support.

BACKGROUND OF THE INVENTION

Information handling systems, such as a desktop computer, server, Internet appliance, and the like, encounter a variety of stresses that may cause a circuit board included in the information handling system to flex, thereby resulting in damage to the system. Thus, the flexing of a circuit board in an information handling system is of great concern, such as when the information handling system is shipped, mobile information handling system transported, and the like. Such movement may cause shock and vibration to be transferred to components included and attached to the printed circuit board (PCB), thereby resulting in broken contacts, chips and the like.

Additionally, as processors are getting faster, the heat generated by the processors is increasing. Heat sinks are effective in cooling the processor, but with the increase in heat comes a corresponding increase in the size and weight of the heat sink needed to efficiently cool the processor. The increased weight of the heat sink may further increase the likelihood of damage to the circuit board, especially when attached directly to the circuit board. For example, jarring encountered from shipping the information handling system may cause the heat sink to flex the circuit board, thereby resulting in damage.

Further, manufacture and assembly must be accomplished efficiently in order to effectively compete in modern markets. Manufacturers continually strive to lower production time, yet provide an intuitive and effective system for updating the information handling system with additional and/or replacement components. Configurations that result in lower production times and increased quality result in a competitive advantage in the marketplace.

Therefore, it would be desirable to provide an improved circuit board support.

SUMMARY OF THE INVENTION

Accordingly, the present invention is directed to an improved circuit board support. The present invention provides for quick-assembly, limits circuit board flex, and supports a heat sink. In a first aspect of the present invention, an apparatus suitable for supporting a circuit board includes a support suitable for attachment to a chassis of an information handling system, wherein a heat sink may be attached through a circuit board to the support so as to enable the heat sink to be supported by the chassis.

In a second aspect of the present invention, an apparatus comprises a surface, and a circuit board having a first side and a second side. A support is disposed between the surface and the second side of the circuit board. A heat sink is disposed on the first side of the circuit board, wherein the heat sink is suitable for contacting a component disposed on the first side of the circuit board, the heat sink mounted through the circuit board to the support disposed on the second side of the circuit board.

In a third aspect of the present invention, an apparatus suitable for supporting a circuit board includes a chassis, a circuit board and at least one support disposed between the chassis and the printed circuit board. A heat sink is disposed on the first side of the circuit board, wherein the heat sink is suitable for contacting a component disposed on the first side of the circuit board, the heat sink mounted through the circuit board to the support disposed on the second side of the circuit board.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings. This application incorporates patent application Ser. No. 09/639,686, Motherboard Mounting Assembly, filed Aug. 14, 2000, in its entirety.

Referring generally now to FIGS. 1 through 5, exemplary embodiments of the present invention are shown. Information handling systems, such as desktop computers, servers, Internet appliances, convergence systems, digital information appliances, and the like, typically include a processor and a heat sink for dissipating heat generated by the processor. However, with the ever-increasing speed of processors, the heat sinks utilized to cool these processors are increasing in weight and/or size. Further, in mobile information handling systems, and even non-mobile information handling systems when shipped, may encounter stresses that cause a circuit board included in the system to flex.

Figure 1:
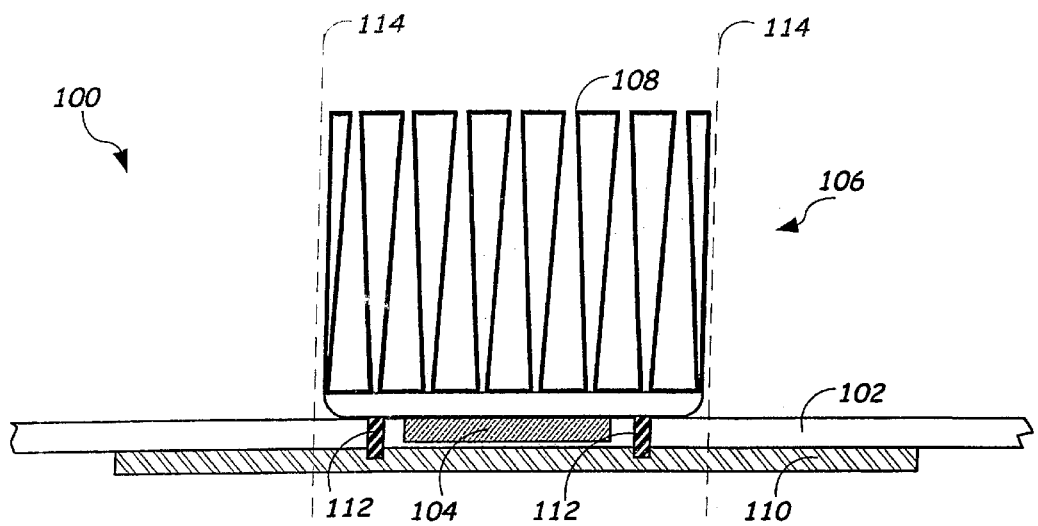
FIG. 1 is a cross-sectional side illustration of an exemplary embodiment of the present invention wherein a heat sink mounted to a support through a circuit board is shown.

Referring now to FIG. 1, an exemplary embodiment 100 of the present invention is shown wherein a heat sink is mounted to a support through a circuit board to reduce stress on the circuit board. A circuit board 102 may include an integrated circuit 104, such as a semiconductor including a chip, processor and the like, which, in operation, generates an undesirable quantity of heat. To dissipate this heat, a heat sink 106 is disposed on a first side of the integrated circuit 104 to absorb and dissipate the heat produced. A heat sink 106 is generally configured as a device that absorbs and dissipates heat produced by an electrical component, such as an integrated circuit to prevent overheating, which may cause damage to the component itself as well as surrounding components. A heat sink 106 is preferably formed of some sort of heat conductive material, such as metal, and may include fins 108 to assist in transferring heat to the surrounding environment. As stated earlier, larger and larger heat sinks have been required to address the increased heat generated by faster processors and the like.

To brace the heat sink 106 from damaging the circuit board 102 and components contained thereon, such as integrated circuits 104 and the like, a support 110 is provided to limit movement of the heat sink 106 as may be encountered during shipping, mobile use, and the like. The heat sink 106, disposed on a first side of the circuit board 102, is attached to the support 110 disposed on the second side of the circuit board 102. The heat sink 106 may be attached to the support 110 through the use of screws 112, rivets, and the like as contemplated by a person of ordinary skill in the art. In this instance, the support 110 is configured to extend at least generally equal to and preferable beyond the heat sink 106 along the circuit board 102 and is disposed on a second side of the circuit board 102. In this way, the support 110 may bolster the heat sink 106 against the circuit board 102 and thereby limit flexing of the circuit board 102 and the components thereon. Although a support 110 formed at least generally equal to, and preferable beyond the boundaries 114 of at least a portion of the heat sink 106 is described, it should be apparent that a wide variety of supports, such as support shapes and configurations, are contemplated by the present invention without departing from the spirit and scope thereof.

Figure 2:
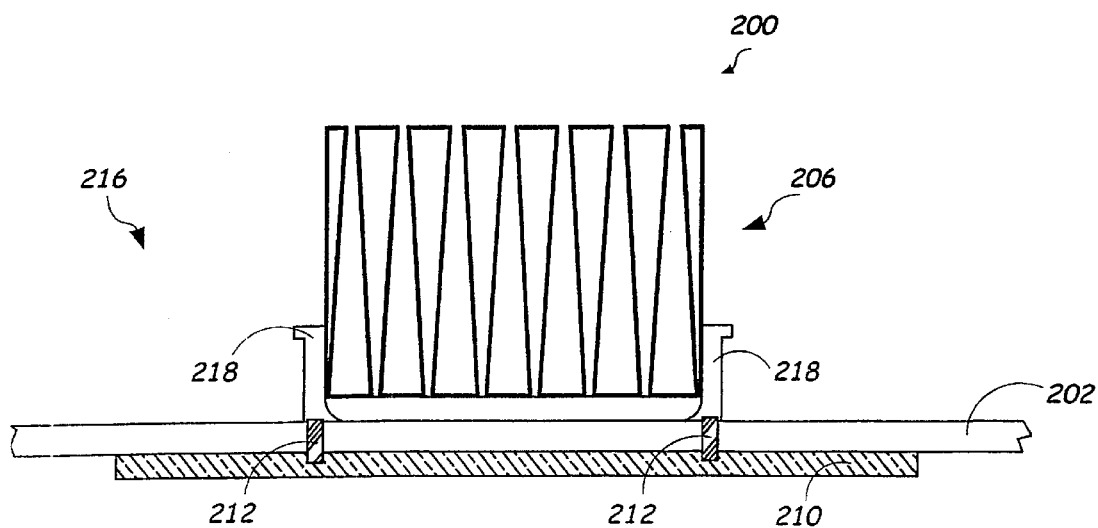
FIG. 2 is a cross-sectional side illustration of an exemplary embodiment of the present invention wherein a retention device is utilized to mount a heat sink to a support of the present invention.

Referring now to FIG. 2, an exemplary embodiment 200 of the present invention is shown wherein a retention device is utilized to mount a heat sink to a support of the present invention. To ease in the attachment and removal of a heat sink 206 from a circuit board 202 and support 210 of the present invention, a retention device 216 may be provided. The heat sink 206 is attached to the retention device 216 with two clips 218, preferably formed of metal, which are formed to engage the heat sink 206. The clips 218 of the retention device 216 may be flexed outward from the heat sink 206 to enable the heat sink 206 to be removed from the circuit board 202. Screws 212 are utilized to attach the retention device 216 through the circuit board 202 and to the support 210. Thus, like the previous example, the flexing of the circuit board 202 and movement of the heat sink 206 may be minimized, thereby lowering the chances of damage to the circuit board 202 and components contained thereon. It should be apparent that a retention device may be formed in a variety of ways to secure a heat sink to a support without departing from the spirit and scope of the present invention.

Figure 3:
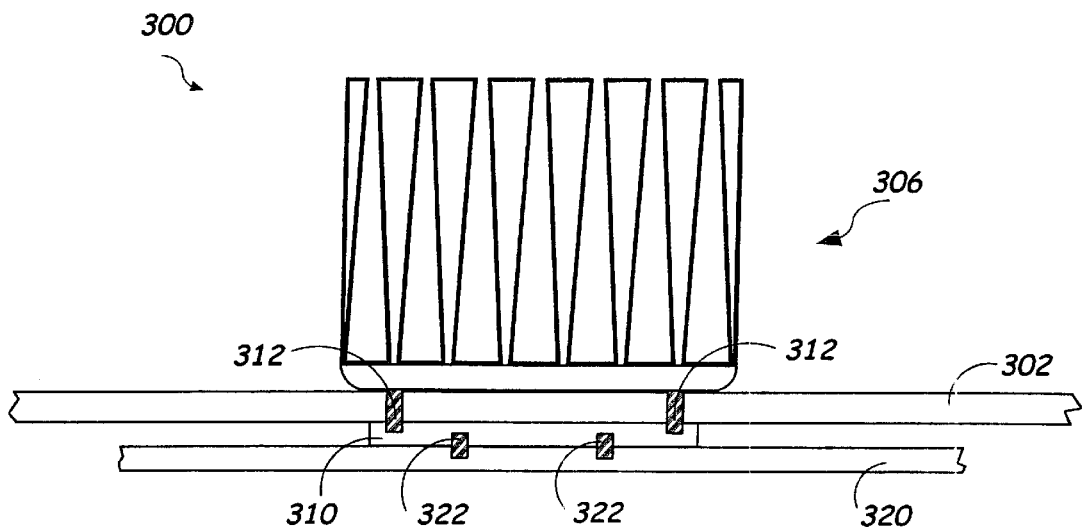
FIG. 3 is a cross-sectional side illustration of an exemplary embodiment of the present invention wherein a support configured to be suitable for connecting to a circuit board and a chassis is shown.
Figure 4A:
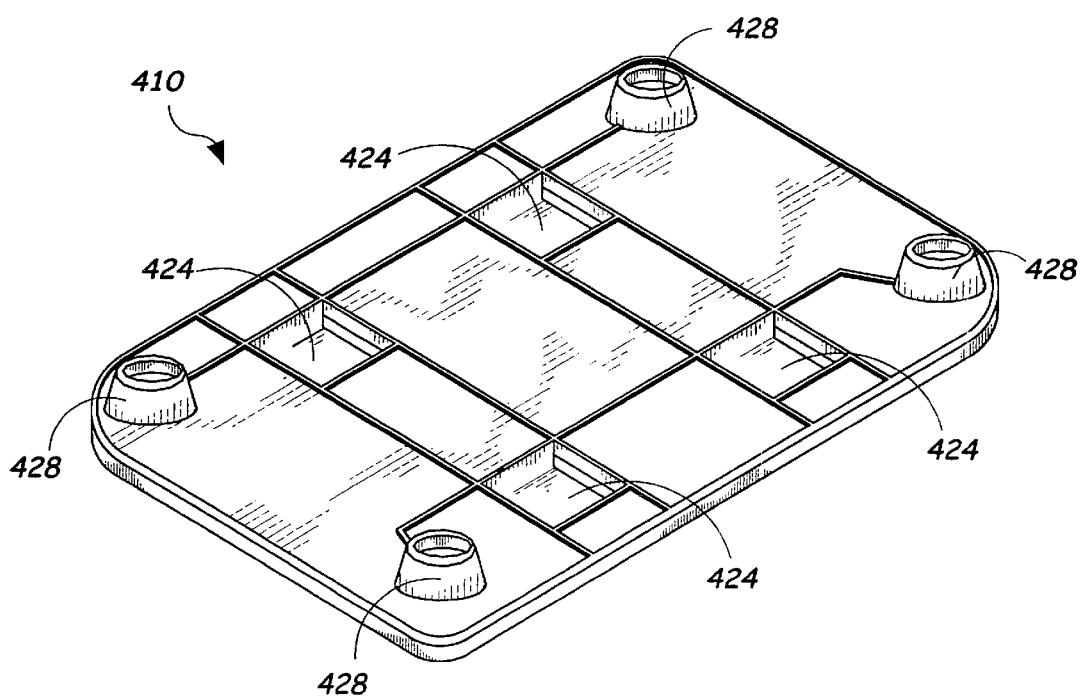
FIG. 4A is an isometric view of an exemplary embodiment of the present invention wherein a support suitable for quick assembly to a surface of a chassis is shown.
Figure 4B:
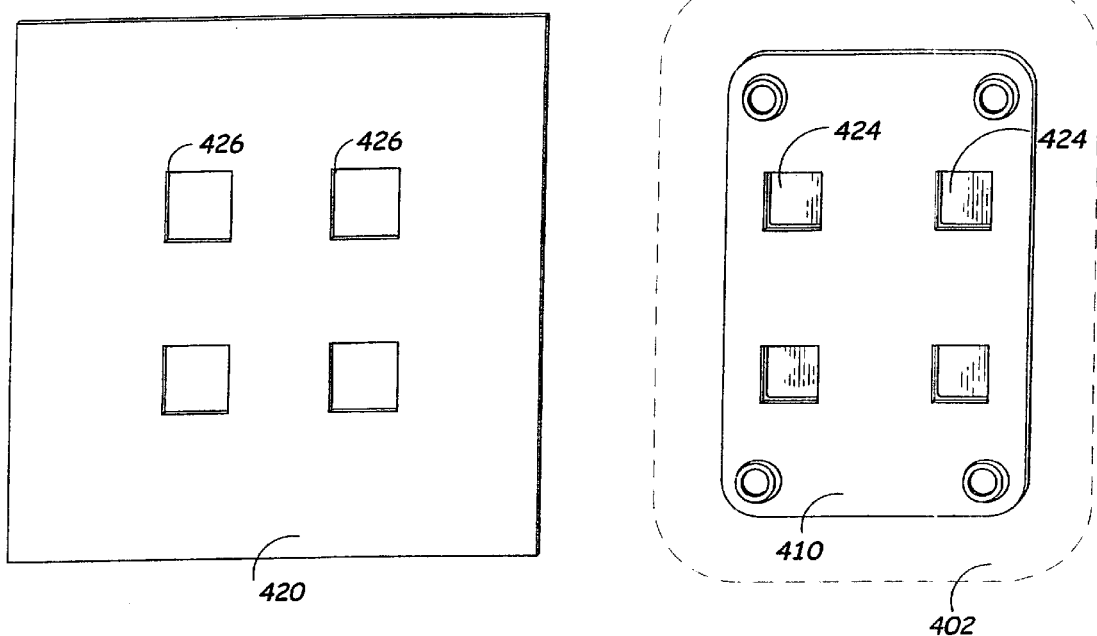
FIG. 4B is a top view of the exemplary embodiment of the present invention as shown in FIG. 4A wherein a support is shown in conjunction with a surface including receptacles suitable for receiving a support of the present invention.
Figure 4C:
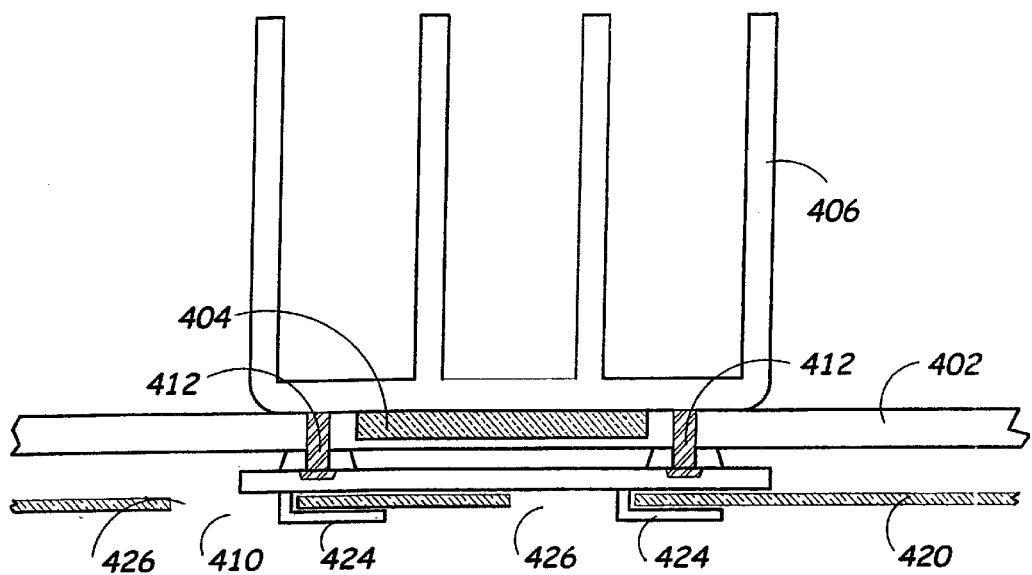
FIG. 4C is a side cross-sectional view of an exemplary embodiment of the present invention wherein a support engages a surface to secure a heat sink to prevent damage to components included on a circuit board.
Figure 5:
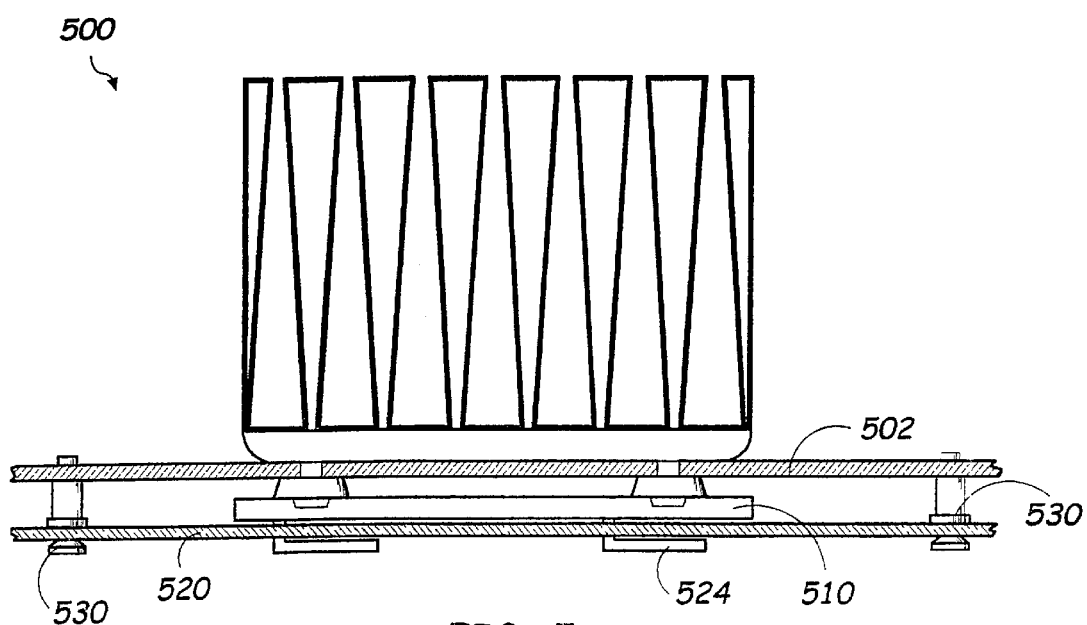
FIG. 5 is a side view of an exemplary embodiment of the present invention wherein a circuit board including standoffs utilizes a support of the present invention to prevent damage to components by securing the circuit board and heat sink.

Referring generally now to FIGS. 3 through 5, exemplary embodiments of the present invention are shown wherein a support is configured to engage a surface, such as a chassis, to further secure a heat sink. A support may be configured to engage a chassis of an information handling system, such as a desktop computer, server, Internet appliance, convergence system, digital information appliance, personal digital assistant, and the like, to limit flexing of a circuit board, such as a motherboard. A chassis may be configured as a tower, desktop unit, handheld unit, "clam-shell", laptop, and the like without departing from the spirit and scope of the present invention. Additionally, a support of the present invention may be configured in a variety of manners to engage a chassis for different circuit board configurations.

Referring now to FIG. 3, an exemplary embodiment 300 of the present invention is shown wherein a support is configured to be suitable for connecting to a circuit board and a chassis. A heat sink 306, located on a first side of a circuit board 302, is attached to a support 310, positioned on a second side of the circuit board 302, with screws 312. The screws 312 may be attached through the heat sink 306 and circuit board 302 and received through metal threaded inserts on the support 310. The support 310 may also be attached to a chassis 320 with additional screws 322. Thus, the heat sink 306 is supported by the chassis 320 to limit unwanted movement and stress caused by the heat sink 306 to the circuit board 302.

Therefore, to install the present embodiment 300, the support 310 is attached to the chassis 320 with the use of screws 322 or the like. The circuit board 302 is positioned next to the support 310, and screws 312 are utilized to attach the heat sink through the circuit board 302 to the support. Although the use of screws 312 & 322 are discussed, it should be apparent that a wide variety of attachment methods and apparatus are contemplated by the present invention without departing from the spirit and scope thereof.

Referring now to FIGS. 4A, 4B and 4C an exemplary embodiment of the present invention is shown wherein a support is configured for quick-assembly and secure attachment of a heat sink to a chassis. A support 410 may be formed from plastic so there is not a problem with electrical shorts. Additionally, the support may be injection molded to give a low part cost. The support may also be machined without departing from the spirit and scope of the present invention. Forming the support from metal may enable the support, and also the chassis to work as cooling devices for the components on the circuit board. For example, heat may be conducted from the heat sink 406 through conductive attaching pieces, such as screws and the like, to the support to enable heat to be transferred from the component to the support. Additionally, the support may engage the chassis to further conduct the heat away from the component to the chassis.

The support 410 is configured for quick assembly of the support 410 within a chassis 420 of an information handling system and the like. The support 410 may include latching fingers 424 suitable for engaging receptacles 426 disposed in a chassis 420. The latching fingers 424 in this instance are formed as generally L-shaped protrusions that are suitable for being inserted into the receptacles 426 and slid to a securing position. In this way, the support 410 is braced against the chassis 420 thereby securing a circuit board 402 attached to the support 410. The latching fingers 424 are angled for quick assembly and holding of the circuit board 402 to the chassis 420 under the circuit board. Therefore, the angled finger configuration of the latching fingers 424 assures a tight fit to the chassis. The support 410 fills the space between the bottom of the circuit board 402 and the chassis 420, thereby keeping the circuit board 402 from flexing down/against the support 410 and up/away from the chassis when secured to the support 410.

The support 410 may also include standoffs 428 to increase airflow around the circuit board, and thereby increase the cooling of the circuit board 402 and components contained thereon, such as integrated circuits 404 and the like. For example, in the present illustrations, four standoffs 428 are provided to space the circuit board 402 from the support 410, yet still secure the circuit board 402 to the support 410 and thereby the chassis 420. The support 410 may be attached to the heat sink 406 disposed on an opposing side of a circuit board 402 from the support 410 with the use of screws 412. Additionally, the heat sink 406 may be secured to the support 410 with screws 412, which engage threaded inserts included on the support 410, such as the standoffs 428. It should be apparent that a variety of methods of attaching a heat sink to a support of the present invention are contemplated without departing from the spirit and scope of the present invention.

Therefore, to install the support of the present invention, four screws 412 are utilized through the circuit board 402 to attach the support 410 to the heat sink 406. The latching fingers 424 are then positioned for insertion into the receptacles 426 of the chassis 420. Once inserted, the support 410 and circuit board 402 are slid to secure the latching fingers 424 to the chassis 420. The steps may be reversed to remove the support 410 and circuit board 402 from the chassis. Thus, by utilizing the present invention, valuable time and effort may be saved in the manufacturing process, thereby resulting in a lower product cost and increased consumer demand.

Referring now to FIG. 5, an exemplary embodiment 500 of the present invention is shown wherein a support of the present invention is utilized with circuit board standoffs to provide a secure and efficiently assembled circuit board. An information handling system includes a chassis 520 having at least one mounting panel assembly suitable for mounting and supporting an information handling system's circuit board 502 contained within the chassis 520, such as a motherboard and the like. The chassis 520 includes a surface having a plurality of apertures or slots formed therein for receiving standoffs 530 mounted to the circuit board 502. The present invention thus increases the efficiency in which motherboards or like printed circuit boards may be installed in and removed from information handling systems, such as computer systems or similar electronic devices by greatly reducing the number of fasteners that must be removed from the motherboard, e.g., from typically nine or ten screws requiring tools such as a screwdriver or wrench for their removal to a single thumbscrew fastener or like holding device. This reduction results in faster assembly of the information handling system during manufacture, greater ease of service by the consumer, and less time spent by customer service personnel in providing guidance for removal of the motherboard, often via telephone, Internet chat room. A more detailed description of the installation and utilization of standoffs in conjunction with a circuit board may be found in related patent application Ser. No. 09/639,686, Motherboard Mounting Assembly, filed Aug. 14, 2000, which is hereby incorporated by reference in its entirety.

In FIG. 5, a support assembly including circuit board standoffs is shown as being comprised of a single panel having a generally continuous, flat surface on which a conventional flat circuit board 502 may be mounted. However, it is contemplated that instead of a single panel, mounting panel assemblies in accordance with the present invention may be comprised of a plurality of panels each suitable for positioning one or more slots to receive circuit board standoffs 530 mounted to the circuit board 502 and latching fingers 524 included on the support 510. The support 510 may also be assembled in the circuit board fixture that adds the circuit board standoffs. Further, support assemblies of the present invention should not be viewed as being limited to the generally flattened configuration shown in FIG. 5, but instead may have any shape suitable for positioning slots to receive standoffs mounted to the circuit board 502 or like printed circuit board as contemplated by one of ordinary skill in the art.

It is believed that the circuit board support of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An apparatus suitable for supporting a circuit board, comprising:

a support slidably mounted to a chassis of an information handling system, wherein a heat sink may be attached through a circuit board to the support so as to enable the heat sink to be supported by the chassis.

2. The apparatus as described in claim 1, wherein the support includes at least one latching finger suitable for being received by a receptacle included on the chassis.

3. The apparatus as described in claim 1, wherein the support includes a receptacle suitable for receiving a latching finger included on the chassis.

4. The apparatus as described in claim 1, wherein at least one portion of the support extends beyond a boundary of the heat sink.

5. The apparatus as described in claim 1, wherein the support is disposed on a first side of the circuit board and the heat sink is disposed on a second side of the circuit board.

6. The apparatus as described in claim 1, wherein the support secures the circuit board so as to limit movement of the circuit board in a direction including at least one of toward the chassis and away from the chassis.

7. The apparatus as described in claim 1, wherein the support includes at least one standoff.

8. An apparatus, comprising:

a surface;

a circuit board having a first side and a second side;

a support disposed between the surface and the second side of the circuit board; and a heat sink disposed on the first side of the circuit board, wherein the heat sink is suitable for contacting a component disposed on the first side of the circuit board, the heat sink mounted through the circuit board to the support disposed on the second side of the circuit board, wherein the support is slidably mounted to the surface so as to enable the heat sink to be supported by the surface.

9. The apparatus as described in claim 8, wherein the support includes at least one latching finger suitable for being received by a receptacle included on the chassis.

10. The apparatus as described in claim 8, wherein the support includes a receptacle suitable for receiving a latching finger included on the chassis.

11. The apparatus as described in claim 8, wherein at least one portion of the support extends beyond a boundary of the heat sink.

12. The apparatus as described in claim 8, wherein the support secures the circuit board so as to limit movement of the circuit board in a direction including at least one of toward the chassis and away from the chassis.

13. The apparatus as described in claim 8, wherein the support includes at least one standoff.

14. An apparatus suitable for supporting a circuit board, comprising:
- a chassis;
- a circuit board;
- at least one support disposed between the chassis and the circuit board; and
- a heat sink disposed on the first side of the circuit board, wherein the heat sink is configured to contact a component disposed on the first side of the circuit board, the heat sink mounted through the circuit board to the support disposed on the second side of the circuit board.

15. The apparatus as described in claim 14, wherein the support includes at least one latching finger suitable for being received by a receptacle included on the chassis.

16. The apparatus as described in claim 14, wherein the support includes a receptacle suitable for receiving a latching finger included on the chassis.

17. The apparatus as described in claim 14, wherein at least one portion of the support extends beyond a boundary of the heat sink.

18. The apparatus as described in claim 14, wherein the support secures the circuit board so as to limit movement of the circuit board in a direction including at least one of toward the chassis and away from the chassis.

19. The apparatus as described in claim 14, wherein the support includes at least one standoff.

* * * * *